United States Patent
Mondal

(10) Patent No.: US 7,199,679 B2
(45) Date of Patent: Apr. 3, 2007

(54) BALUNS FOR MULTIPLE BAND OPERATION

(75) Inventor: Jyoti P. Mondal, Palatine, IL (US)

(73) Assignee: Freescale Semiconductors, Inc., Austin, TX (US)

( * ) Notice: Subject to any disclaimer, the term of this patent is extended or adjusted under 35 U.S.C. 154(b) by 46 days.

(21) Appl. No.: 10/978,596

(22) Filed: Nov. 1, 2004

(65) Prior Publication Data

US 2006/0091970 A1    May 4, 2006

(51) Int. Cl.
*H03H 7/42*    (2006.01)
*H03H 11/42*   (2006.01)

(52) U.S. Cl. ............................................. 333/25; 333/26

(58) Field of Classification Search ................. 333/25, 333/26
See application file for complete search history.

(56) References Cited

U.S. PATENT DOCUMENTS

| | | | |
|---|---|---|---|
| 5,477,204 A * | 12/1995 | Li | 336/200 |
| 5,861,853 A * | 1/1999 | Haub et al. | 343/702 |
| 6,137,376 A | 10/2000 | Imbornone et al. | 333/25 |
| 6,396,362 B1 | 5/2002 | Mourant et al. | 333/25 |
| 6,424,227 B1 * | 7/2002 | El-Sharawy | 330/307 |
| 6,437,658 B1 | 8/2002 | Apel et al. | 333/26 |
| 6,653,910 B2 | 11/2003 | Escalera et al. | 333/26 |
| 6,683,510 B1 | 1/2004 | Padilla | 333/25 |
| 6,693,499 B2 | 2/2004 | Goyette et al. | 333/118 |
| 6,707,367 B2 | 3/2004 | Castaneda et al. | 336/200 |
| 6,717,502 B2 | 4/2004 | Yue | 336/200 |
| 6,801,114 B2 | 10/2004 | Yang et al. | 336/200 |
| 6,809,623 B2 * | 10/2004 | Kyriazidou et al. | 336/200 |
| 6,919,858 B2 * | 7/2005 | Rofougaran | 343/850 |
| 6,982,609 B1 * | 1/2006 | McKay et al. | 333/25 |
| 2004/0000968 A1 | 1/2004 | White et al. | 333/185 |
| 2004/0041650 A1 | 3/2004 | De Flaviss | 333/26 |

OTHER PUBLICATIONS

Chip Multiolayer Hybrid Baluns Spec Sheet; dated Feb. 28, 2003.

* cited by examiner

*Primary Examiner*—Dean Takaoka
(74) *Attorney, Agent, or Firm*—Brinks Hofer Gilson & Lione

(57) ABSTRACT

A small size, low cost balun is formed on a substrate, such as gallium arsenide, as an integrated passive device. Multiple baluns are formed on a same substrate, allowing multi-band operation. For example, symmetrical transformers are provided for two different bands of operation, such as for a quad-band GSM application. Each of the two different baluns is used for two different frequency bands of operation of the quad-band device. A ground ring allows two Hi-Q baluns to be formed on the same integrated circuit side-by-side with minimum spacing and minimum impact on phase and amplitude performance over the frequency bands of operation. By using multiple integrated circuit baluns on a same substrate or chip, the size and cost of baluns for multi-band operation may be reduced.

26 Claims, 2 Drawing Sheets

BALUNS FOR MULTIPLE BAND OPERATION

BACKGROUND

The present invention relates to baluns. More specifically, the present invention relates to baluns fabricated on substrates.

Baluns, also known as transformers, are used for transmitters and receivers. The baluns convert differential ports to single ended ports and vice versa. A given balun operates over a band of frequencies.

Originally, cellular telephones operated in a single regime (analog) and in one frequency band, using a single balun for transmission or reception. More recently, cellular telephones operate in multiple regimes or bands, such as operation in the cellular and PCS bands or quad-band phones for operation pursuant to multiple US and European standards.

Multiple baluns may be used for different frequency bands of operation. Where the baluns are wound wire or multi-layer ceramic devices, each extra balun consumes extra space and/or increases cost. This is disadvantageous in portable electronic devices continually required to either be reduced in size or increased in functionality while maintaining the same size.

Space may be saved by integrating a balun on a substrate. However, separate baluns and corresponding chips for different frequency bands are provided to avoid signal loss and interference. Separate baluns may still consume space and increase cost.

BRIEF SUMMARY

By way of introduction, the preferred embodiments described below include baluns, methods and systems for transforming signals at multiple frequency bands. Two or more baluns are integrated on a same substrate adjacent to each other. For example, the baluns are within 100 microns of each other. To avoid interference, isolation rings are formed around the adjacent baluns, such as integrating a figure 8 pattern isolation ring to provide more than 40 dB or other value of isolation. By providing adjacent baluns on a same substrate, multiple baluns for different frequency bands are provided in a low cost component that uses minimal amounts of space.

In a first aspect, an integrated balun is provided. First and second baluns are on a substrate. The baluns are adjacent to each other.

In a second aspect, a transmitter system is provided for transforming signals. A transmitter has two different outputs. Two transformers on a same chip connect with the two different outputs respectively.

In a third aspect, a method is provided for transforming signals in different frequency bands. A first frequency band is transformed with a first integrated circuit balun. A second signal at a second frequency band is transformed with a second integrated circuit balun. The first and second integrated circuit baluns are on the same substrate.

In a fourth aspect, baluns are provided for use at multiple frequency bands. First and second baluns are operable in first and second frequency bands respectively. The first frequency band is different than the second frequency band. The first and second baluns are both on a substrate. An isolation line is around at least part of each of the first and second baluns and at least in part between the first and second baluns in a circuit plane of the substrate.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE EMBODIMENTS

A small size, low cost balun is formed on a substrate, such as gallium arsenide (GaAs), as an integrated passive device. Multiple baluns are formed on a same substrate, allowing multi-band operation. For example, symmetrical transformers are provided for two different bands of operation, such as for a quad band GSM application. Each of the two different baluns is used for two different frequency bands of operation of the quad band device. A ground ring allows two Hi-Q baluns to be formed on the same integrated circuit side-by-side with minimum spacing and impact on phase and amplitude performance over the frequency bands of operation. By using multiple integrated baluns on a same substrate or chip, the size of the baluns for multi-band operation may be reduced as well as the cost.

Figure 1:
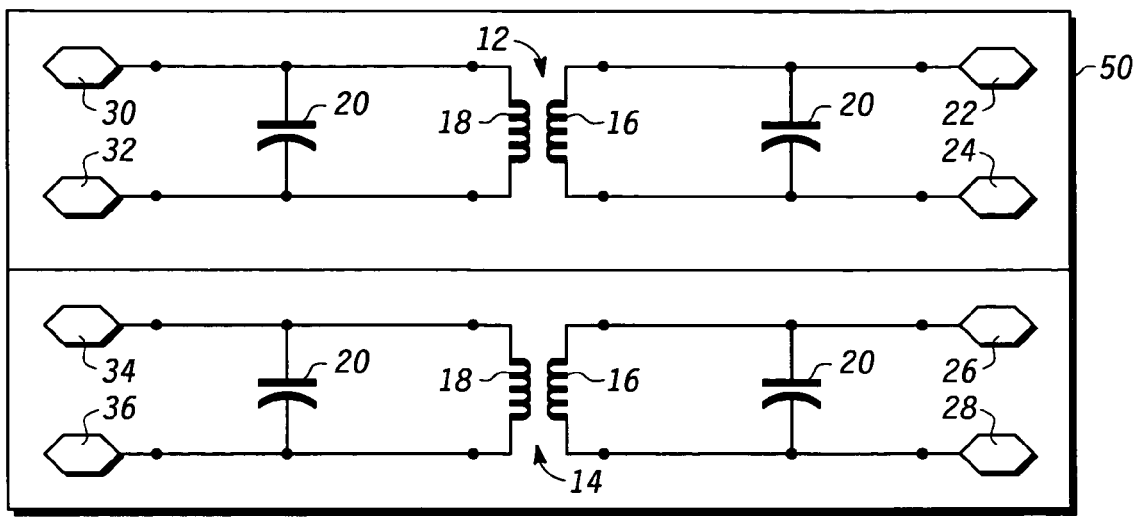
FIG. 1 is a circuit schematic of one embodiment of a plurality of integrated baluns.
Figure 2:
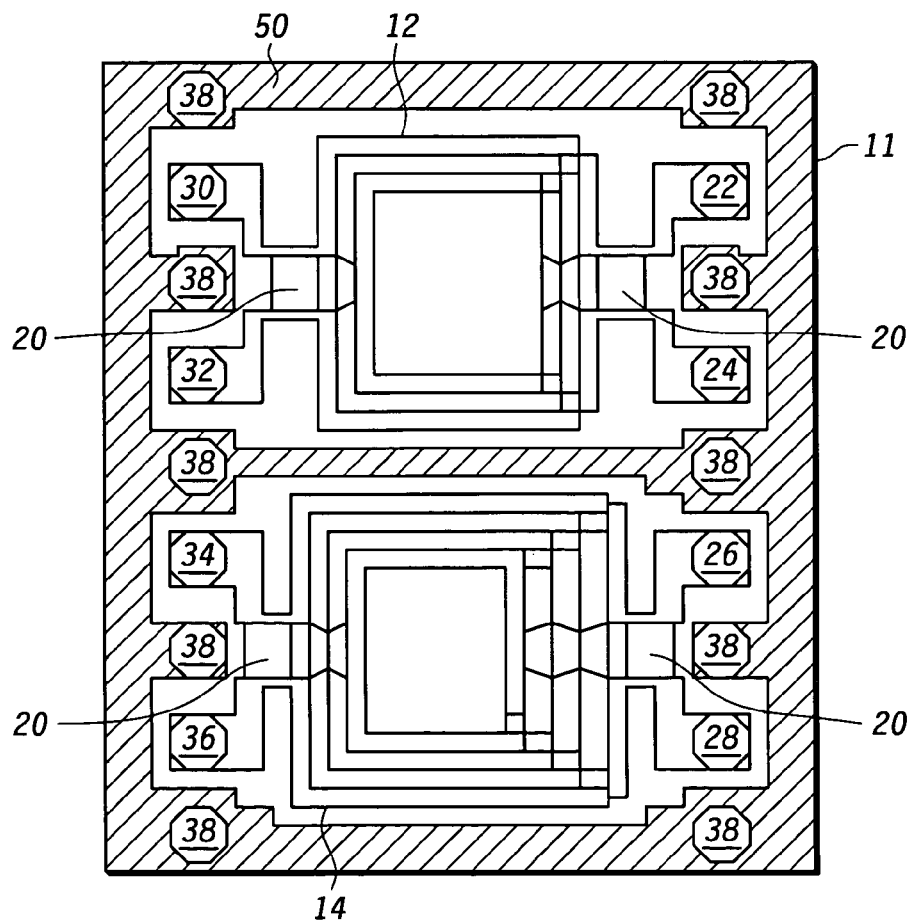
FIG. 2 is a top plan diagram of one embodiment of multiple baluns integrated on a chip.

FIG. 1 shows one embodiment of a circuit diagram for a plurality of baluns 12, 14. FIG. 2 shows the circuit of FIG. 1 as an integrated circuit 10 on a substrate 11. The circuit 10 includes a plurality of input or output ports 22–36, baluns 12, 14, tunning capacitors 20 and ground trace 50. Additional, different or fewer components may be provided. For example, three or more baluns are integrated on the same substrate 11 for the circuit 10. In one embodiment, the circuit 10 is used with quad-band mobile telephones or GSM applications. For example, one balun 12 is operable over the frequency ranges 1705–1780 Megahertz and 1850–1910 Megahertz, and the other balun 14 is operable over the frequency bands of 824–849 Megahertz and 880–915 Megahertz. Different frequency bands or applications may be provided.

The substrate 11 is silicon, gallium arsenide (GaAs), combinations thereof or other now known or later developed semiconductor. The substrate 11 is used with CMOS, integrated passive device process or other semiconductor process for forming the circuit 10 on a chip. The substrate 11 defines a circuit plane where etching, deposition or other techniques are used to form the circuit 10 in one or more layers.

The baluns 12, 14 are transformers or coils. In one embodiment, each of the baluns 12, 14 is a symmetric Hi-Q resonant transformer. Each balun includes two or more windings, coils or folds 16, 18. Other symmetric or asymmetric balun structures may be used, such as a folded ring. Symmetrical baluns provide for more constant phase response. While shown as single tap transformers, the baluns 12, 14 may have additional taps and associated windings or coils. The baluns 12, 14 have 50 ohms, 100 ohms, 200 ohms or other values of impedance. The baluns 12, 14 can be designed to operate up to 100 Gigahertz on a gallium arsenide substrate 11. The baluns 12, 14 are formed on the substrate 11 with a same or similar structure. Each balun 12, 14 may be of a different type, size, structure or shape that other of the integrated baluns 12, 14.

In one embodiment, the baluns 12, 14 are sized or shaped differently to operate over different frequency bands. For example, one balun 12 is operable for a higher frequency band than the other balun 14. The frequency bands may overlap or be separate. For quad-band mobile telephones, one of the baluns 14 is sized to provide optimum frequency response in a cellular band, EGSM band or both the cellular and EGSM bands. For example, the low frequency balun 14 is sized for a center frequency of about 866 Megahertz with a band covering the desired range. The other balun 12 is sized to be operable in higher frequency bands, such as the DCS band, PCS band or combinations thereof For example, the high frequency balun 12 is sized for a center frequency of about 1,807 Megahertz with a band over the desired range. Other continuous or discontinuous frequency bands in operation for any given balun 12, 14 may be provided. Baluns operable in a same, similar or different frequency bands that differ for phase response, amplitude response, structure or other ways may be provided. In an alternative embodiment, the baluns 12, 14 are of a similar size, structure or other characteristics.

The baluns 12, 14 are within 100 microns of each other on the substrate 11 of a same integrated circuit or chip. The edges or points on the baluns 12, 14 closest to each other are within 100 microns. Greater or lesser separations may be provided. Such close spacing of two adjacent baluns 12, 14 on a single chip may allow for a dual balun design of 1.45 millimeters by 1.25 millimeters and a thickness of 0.25 millimeters. The chip size, including the scribe width, may be about 1356 micrometers by 1530 micrometers and a thickness of about 254 micrometers. Smaller or larger chip dimensions may be provided.

The capacitors 20 are tuning capacitors. Metal-insulator-metal or other integrated or discrete capacitors are provided between the input ports 22, 24 and 26, 28 and the output ports 30, 32 and 34, 36. The capacitors 20 act to resonate the primary and secondary sides of the baluns 12, 14. The capacitors are selected as a function of the frequency of operation of each balun 12, 14.

The ground trace 50 is a gold, copper or other conductive trace operable to be connected with a ground or other direct current potential. The ground trace 50 is shaped and sized to provide about 40 dB of isolation between the baluns 12 and 14, but greater or lesser amounts of isolation may be provided. The ground trace 50 is 40 microns, 50 microns or other greater or lesser size and width and 10 microns or greater or lesser size in thickness. The widths may vary as a function of location along the ground trace 50. The width of the ground trace may depend on the dielectric constant of the substrate 11 being used.

The ground trace 50 at least partially isolates the adjacent baluns 12, 14 on the substrate 11. The ground trace 50 is around at least part of each of the baluns 12, 14, but may alternatively be only between the baluns 12, 14. In one embodiment, the ground trace 50 is one or more isolation rings. Each of the isolation rings extends around each of the baluns 12, 14 as an isolation line. The rings share a common isolation line between the baluns 12, 14, forming a figure 8 shape. The isolation lines or ground trace rings are around and between the baluns 12, 14 in a circuit plane of the substrate 11. In alternative embodiments, gaps are provided in the ground trace 50, the ground trace 50 is in part or entirety on a higher or lower plane than the baluns 12, 14, and/or the ground trace 50 is the same or different thicknesses than the trace lines used to form the baluns 12, 14.

Each of the baluns 12, 14 is within about 100 microns, 50 microns, 40 microns, 34 microns or other distance of the isolation line of the ground trace 50 extending between the baluns 12, 14. Greater or lesser distances may be provided. One balun 14 may be a greater or lesser distance away from the ground trace 50 between the baluns 12, 14 than the other balun 12.

Figure 3:
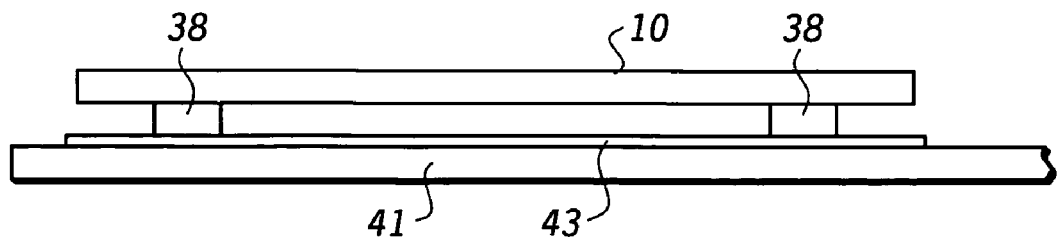
FIG. 3 is a side view of one embodiment of integrated baluns connected with a circuit board.

FIG. 3 shows one embodiment of the use of integrated baluns circuit 10. The integrated baluns circuit 10 and associated chip are a standalone device with two or more baluns 12, 14. The pads 22 through 36 for connection with the baluns 12, 14 and the pads 38 for connection with the ground trace 50 have a gold or other material bonded to or deposited on them. Flip-chip bonding is then used to electrically connect the circuit 10 to a different circuit board 41. Bumps with a diameter and height of about 100 microns may be used with flip-chip packaging for reduced surface area requirements of the circuit 10. For wire bonding, larger pads may be provided. In alternative embodiments, wire bonding, vias, conductive epoxy, or other now known or later developed techniques for connecting the integrated circuit 10 to other devices or circuitry is used.

In one embodiment, the integrated baluns circuit 10 is free of a ground plane on the substrate 11. The ground trace 50 alone or in conjunction with a ground plane 43 formed on the other circuit board 41 isolates the circuitry from interference. The ground plane 43 is formed on the other circuit board 41 to be a same size, greater in size or lesser in size than a surface area of the integrated circuit 10. Conductive epoxy or other glue maintains the integrated circuit 10 adjacent to the ground plane 43 and other circuit board 41. The ground plane 43 is patterned to allow connection with the different paths 22–38 of the integrated circuit 10. Where 10 is not flipped as used in a wire bond assembly and variation in height from application epoxy is undesired, a ground plane may be formed on the substrate 11 on an opposite side or at a different layer than the circuit plane. A ground plane may be formed for other reasons.

Figure 4:
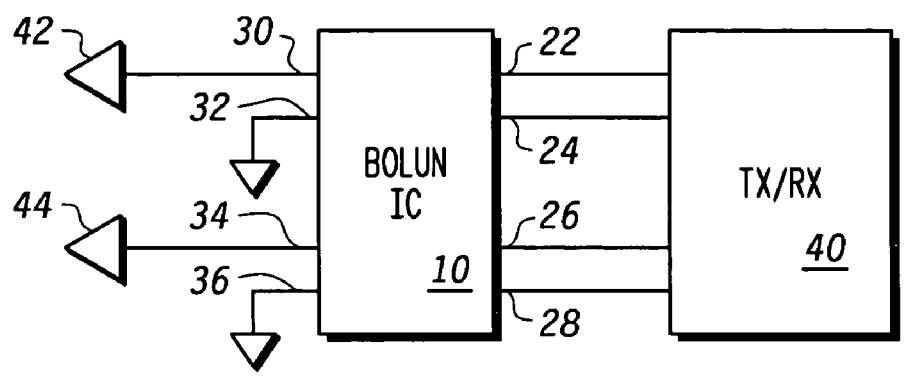
FIG. 4 is a block diagram of one embodiment of a circuit using integrated baluns.

FIG. 4 shows one embodiment of a transmitter or receiver system for transforming signals. The system includes transmitter or receiver electronics 40, an integrated circuit 10 as a chip, and other devices, such as amplifiers 42 and 44. Additional, different or fewer components may be provided, such as providing for filters or amplifiers 42 and 44 being input into the integrated circuit 10 or chip rather than amplifying an output.

The transmitter or receiver electronics 40 is an integrated circuit using one or more channels for transmitting or receiving radio frequency information. In one embodiment, the transmitter or receiver electronics 40 is a transceiver integrated circuit operable at different frequency bands. For example, the transmitter or receiver electronics 40 is a quad band or mobile phone transmitter and/or receiver. As a transmitter, two or more outputs or ports are provided. For example, two differential outputs are provided. Each pair of the differential outputs is associated with a different frequency band of operation or signals otherwise intended for different baluns 12, 14. As a receiver, two or more inputs or ports are provided.

The integrated circuit 10 includes two or more transformers (e.g, baluns) on the same chip. One transformer is connected with one pair of the outputs of the transmitter and the other transformer is connected with the other output pair of the transmitter. For example, one transformer has differential inputs 22, 24 for receiving signals 180° of phase. The other transformer has inputs 26, 28 for connecting with another differential output pair. Each of the transformers or baluns 12, 14 of the integrated circuit 10 operate to provide single ended outputs. For example, each of the transformers includes an output 32, 36 connected with ground. Another output 30, 34 of each of the transformers is provided for further processing or transmission. In alternative embodiments, single ended inputs and/or differential outputs are provided for one or more of the transformers on the integrated circuit 10. The integrated circuit 10 is a discrete component without other electronics. In alternative embodiments, the integrated circuit 10 is formed on a same substrate as circuitry of the transmitter or receiver electronics 40.

The amplifiers 42 and 44 are power amplifiers. The power amplifiers 42, 44 are operable in a frequency range of interest, such as one power amplifier 42 for a higher frequency band and the other amplifier 44 being for a lower frequency band. The output of the amplifiers 42 and 44 are provided to one or more antennas, filters or other devices. For operation as a receiver path, the amplifiers 42 and 44 are preamplifiers.

Figure 5:
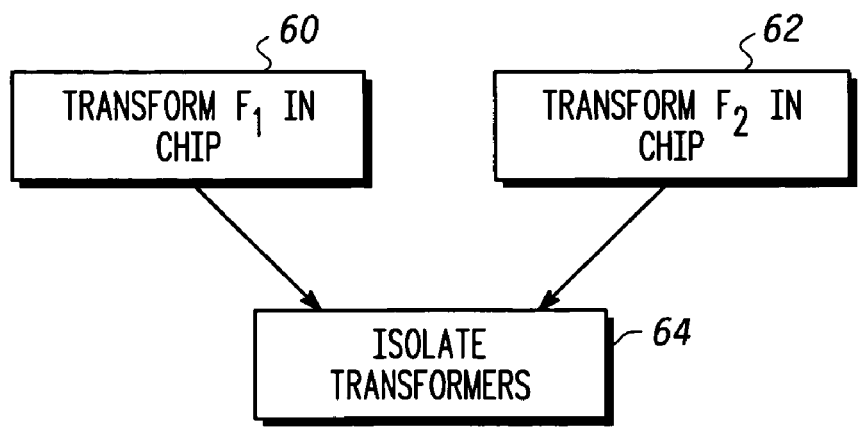
FIG. 5 is a flow chart diagram of one embodiment of a method for transforming signals in different frequency bands.

FIG. 5 shows one embodiment of a method for transforming signals in different frequency bands. The method of FIG. 5 is implemented using the circuits 10 of FIG. 1, FIG. 2, FIG. 3 and/or FIG. 4, but other circuits may be used. Additional, different or fewer acts than shown in FIG. 5 may be used.

In act 60, a signal at a first frequency band is transformed with an integrated circuit balun. For example, a transmit or receive signal for a mobile phone frequency band is transformed. A single ended or differential input is transformed to a differential or single ended output. Other transformations may be provided.

In act 62, a different signal at a different frequency band is transformed with a different integrated circuit balun. The different integrated circuit balun is on a same substrate and chip as the integrated circuit balun used in act 60. The second signal is in a frequency band different than the first signal, such as being at a second mobile phone frequency pursuant to a different standard than the signal transformed in act 60. A differential or single ended input is transformed to a single ended or differential output, but other transformations may be provided.

The two transformations in act 60 and 62 are provided within the same discrete component, such as on an integrated circuit having both baluns. To save space, the baluns are integrated adjacent to each other.

In act 64, the integrated circuit baluns are isolated from each other. The isolation is performed with an isolation trace on the substrate within the integrated circuit. The isolation trace is positioned between the integrated circuit baluns. An isolation trace may extend around the multiple baluns in two or three dimensions. The act of isolating is performed passively by the isolation trace during acts 60 and 62 or actively by forming the trace prior to performing acts 60 and 62.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. An integrated circuit comprising:
    a substrate;
    a first balun that is operable in a first frequency band on the substrate;
    a second balun that is operable in a second frequency band on the substrate, the second frequency band different than the first frequency band; and
    an isolation line around at least part of each of the first and second baluns and at least in part between the first and second baluns in a circuit plane of the substrate.

2. The integrated circuit balun of claim 1 wherein the first and second baluns comprise symmetric Hi-Q resonant transformers.

3. The integrated circuit balun of claim 1 wherein the first balun is operable over a first frequency band, and the second balun is operable over a second frequency band, the second frequency band different than the first frequency band.

4. The integrated circuit balun of claim 3 wherein a first size of the first balun corresponds to the first frequency band, and a second size of the second balun corresponds to the second frequency band.

5. The integrated circuit balun of claim 3 wherein the first frequency band is a DCS band, PCS band or combinations thereof and the second frequency band is a Cellular band, EGSM band or combinations thereof.

6. The integrated circuit balun of claim 1 wherein the substrate comprises GaAs.

7. The integrated circuit balun of claim 1 wherein the substrate comprises silicon.

8. The integrated circuit balun of claim 1 further comprising a third balun adjacent to the first and second baluns.

9. The integrated circuit balun of claim 1 further comprising a ground trace between the first and second baluns.

10. The integrated circuit balun of claim 9 wherein the ground trace is around at least part of each of the first and second baluns.

11. The integrated circuit balun of claim 10 wherein the ground trace comprises at least first and second connected isolation rings, the first isolation ring around the first balun and the second isolation ring around the second balun.

12. The integrated circuit balun of claim 9 wherein the integrated circuit balun is free of a ground plane on the substrate.

13. The integrated circuit balun of claim 1 wherein a first edge of the first balun is within 100 microns of the second edge of the second balun.

14. The integrated circuit balun of claim 1 wherein the first balun comprises a first primary and a first secondary windings and the second balun comprises a second primary and a second secondary windings, further comprising a first capacitor connected with the first primary winding, a second capacitor connected with the first secondary winding, a third capacitor connected with the second primary winding and a fourth capacitor connected with the second secondary winding.

15. The integrated circuit balun of claim 1 further comprising at least a first tuning capacitor on the substrate and connected with the first balun.

16. The integrated circuit balun of claim 1 wherein the first and second baluns are electrically isolated from each other.

17. The integrated circuit balun of claim 1 wherein the first and second baluns have differential outputs, the differential outputs from the first balun do not connect to the differential outputs from the second balun.

18. The integrated circuit balun of claim 17 wherein the differential outputs from the first balun are associated with different frequency bands of operation than the differential outputs from the second balun.

19. The integrated circuit balun of claim 17 wherein the differential inputs from the first balun are associated with different frequency bands of operation than the differential inputs from the second balun.

20. The integrated circuit balun of claim 1 wherein the first and second baluns have differential inputs, the differential inputs from the first balun do not connect to the differential inputs from the second balun.

21. A method for transforming signals in different frequency bands, the method comprising:
 (a) transforming a first signal at a first frequency band with a first integrated circuit balun;
 (b) transforming a second signal at a second frequency band with a second integrated circuit balun, the first and second integrated circuit baluns being on a same substrate; and
 (c) isolating the first integrated circuit balun from the second integrated circuit balun with an isolation trace on the substrate between the first and second integrated circuit baluns.

22. The method of claim 21 wherein (a) comprises transforming at a first mobile phone frequency band and (b) comprises transforming at a second mobile phone frequency band, the first mobile phone frequency band different than the second mobile phone frequency band.

23. Baluns for use at multiple frequency bands, the baluns comprising:
 a first balun operable in a first frequency band, the first balun on a substrate;
 a second balun operable in a second frequency band, the second frequency band different than the first frequency band, the second balun on the substrate; and
 an isolation line around at least part of each of the first and second baluns and at least in part between the first and second baluns in a circuit plane of the substrate.

24. The baluns of claim 23 wherein the isolation line comprises a ground trace ring around and between the first and second baluns.

25. The baluns of claim 23 wherein the first and second baluns comprises symmetric Hi-Q transformers, each within 100 microns of the isolation line between the first and second transformers.

26. The baluns of claim 23 further comprising a capacitor on the substrate and connected with the first balun.

\* \* \* \* \*